(12) United States Patent
Bai et al.

(10) Patent No.: US 11,170,141 B2
(45) Date of Patent: Nov. 9, 2021

(54) GRAPH TRANSFORMER NEURAL NETWORK FORCE FIELD FOR PREDICTION OF ATOMIC FORCES AND ENERGIES IN MOLECULAR DYNAMIC SIMULATIONS

(71) Applicant: Robert Bosch GmbH, Stuttgart (DE)

(72) Inventors: Shaojie Bai, Pittsburgh, PA (US); Jeremy Zieg Kolter, Pittsburgh, PA (US); Mordechai Kornbluth, Brighton, MA (US); Jonathan Mailoa, Cambridge, MA (US); Devin Willmott, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 244 days.

(21) Appl. No.: 16/569,308

(22) Filed: Sep. 12, 2019

(65) Prior Publication Data

US 2021/0081505 A1   Mar. 18, 2021

(51) Int. Cl.
*G06F 30/20* (2020.01)
*G06F 17/16* (2006.01)
*G06F 16/901* (2019.01)
*G06N 3/04* (2006.01)

(52) U.S. Cl.
CPC .......... *G06F 30/20* (2020.01); *G06F 16/9024* (2019.01); *G06F 17/16* (2013.01); *G06N 3/04* (2013.01)

(58) Field of Classification Search
None
See application file for complete search history.

(56) References Cited

U.S. PATENT DOCUMENTS

2020/0365236 A1* 11/2020 Park .................. G06N 3/08

OTHER PUBLICATIONS

K.T. Schutt, et al. SchNet: A continuous-filter convolutional neural network for modeling quantum interactions. arXiv:1706.08566 (2017).
T. Xie, et al. Crystal Graph Convolutional Neural Networks for an Accurate and Interpretable Prediction of Material Properties. Phys. Rev. Lett. 120, 145301 (2018).
P. Velockovic, et al. Graph Attention Networks. arxiv:1710.10903 (2018).

(Continued)

*Primary Examiner* — Craig C Dorais
(74) *Attorney, Agent, or Firm* — Brooks Kushman P.C.

(57) ABSTRACT

A simulation includes converting a molecular dynamics snapshot of elements within a multi-element system into a graph with atoms as nodes of the graph; defining a matrix such that each column of the matrix represents a node in the graph; defining a distance matrix according to a set of relative positions of each of the atoms; iterating through the GTFF using an attention mechanism, operating on the matrix and augmented by incorporating the distance matrix, to pass hidden state from a current layer of the GTFF to a next layer of the GTFF; performing a combination over the columns of the matrix to produce a scalar molecular energy; making a backward pass through the GTFF, iteratively calculating derivatives at each of the layers of the GTFF to compute a prediction of force acting on each atom; and returning the prediction of the force acting on each atom.

20 Claims, 3 Drawing Sheets

(56) References Cited

OTHER PUBLICATIONS

J.P. Mailoa, et al. arXiv:1905.02791. A Fast Neural Network Approach for Direct Covariant Forces Prediction in Complex Multi-Element Extended Systems. Accepted in Nat. Mach. Intell. (2019).
B. Chen, et al. Path-Augmented Graph Transformer Network. arXiv:1905.12712 (2019).

* cited by examiner

GRAPH TRANSFORMER NEURAL NETWORK FORCE FIELD FOR PREDICTION OF ATOMIC FORCES AND ENERGIES IN MOLECULAR DYNAMIC SIMULATIONS

TECHNICAL FIELD

This invention relates generally to graph transformer neural network force field (GTFF) computational algorithms for direct prediction of atomic forces in molecular dynamics computer simulations in material systems, such as electrochemical and water filtration devices.

BACKGROUND

Molecular dynamics is a computational materials science methodology for simulating the motion of atoms in a material system at real operating pressure and temperature conditions. Methodologies exist to calculate the underlying atomic forces used in the simulation of the motion of atoms. One methodology is the ab-initio quantum mechanics approach. This approach is very accurate but is also very expensive because of the tremendous amount of computational resources necessary to apply the approach. While other approaches exist that consume less computational resources, these other approaches do not deliver as much accuracy.

SUMMARY

According to one or more illustrative examples, a computational method for simulating the motion of elements within a multi-element system using a graph transformer neural network (GTFF) includes converting a molecular dynamics snapshot of the elements within the multi-element system into a graph with atoms as nodes of the graph; defining a matrix such that each column of the matrix represents a node in the graph; defining a distance matrix according to a set of relative positions of each of the atoms; iterating through the GTFF using an attention mechanism, operating on the matrix and augmented by incorporating the distance matrix, to pass hidden state from a current layer of the GTFF to a next layer of the GTFF; performing a combination over the columns of the matrix to produce a scalar molecular energy; making a backward pass through the GTFF, iteratively calculating derivatives at each of the layers of the GTFF to compute a prediction of the force acting on each atom; and returning the prediction of the force acting on each atom.

According to one or more illustrative examples, a computational system for simulating motion of elements within a multi-element system using a graph transformer neural network (GTFF), includes a memory storing instructions of a GTFF algorithm of molecular dynamics (MD) software; and a processor programmed to execute the instructions to perform operations including to convert a molecular dynamics snapshot of the elements within the multi-element system into a graph with atoms as nodes of the graph; define a matrix such that each column of the matrix represents a node in the graph; define a distance matrix according to a set of relative positions of each of the atoms; iterate through the GTFF using an attention mechanism, operating on the matrix and augmented by incorporating the distance matrix, to pass hidden state from a current layer of the GTFF to a next layer of the GTFF; perform a combination over the columns of the matrix to produce a scalar molecular energy; make a backward pass through the GTFF, iteratively calculating derivatives at each of the layers of the GTFF to compute a prediction of force acting on each atom; and return the prediction of the force acting on each atom.

According to one or more illustrative examples, a non-transitory computer-readable medium includes instructions for simulating motion of elements within a multi-element system using a graph transformer neural network (GTFF) that, when executed by a processor, cause the processor to convert a molecular dynamics snapshot of the elements within the multi-element system into a graph with atoms as nodes of the graph; define a matrix such that each column of the matrix represents a node in the graph; define a distance matrix according to a set of relative positions of each of the atoms; iterate through the GTFF using an attention mechanism, operating on the matrix and augmented by incorporating the distance matrix, to pass hidden state from a current layer of the GTFF to a next layer of the GTFF; perform a combination over the columns of the matrix to produce a scalar molecular energy; make a backward pass through the GTFF, iteratively calculating derivatives at each of the layers of the GTFF to compute a prediction of force acting on each atom; and return the prediction of the force acting on each atom.

DETAILED DESCRIPTION

Figure 1:
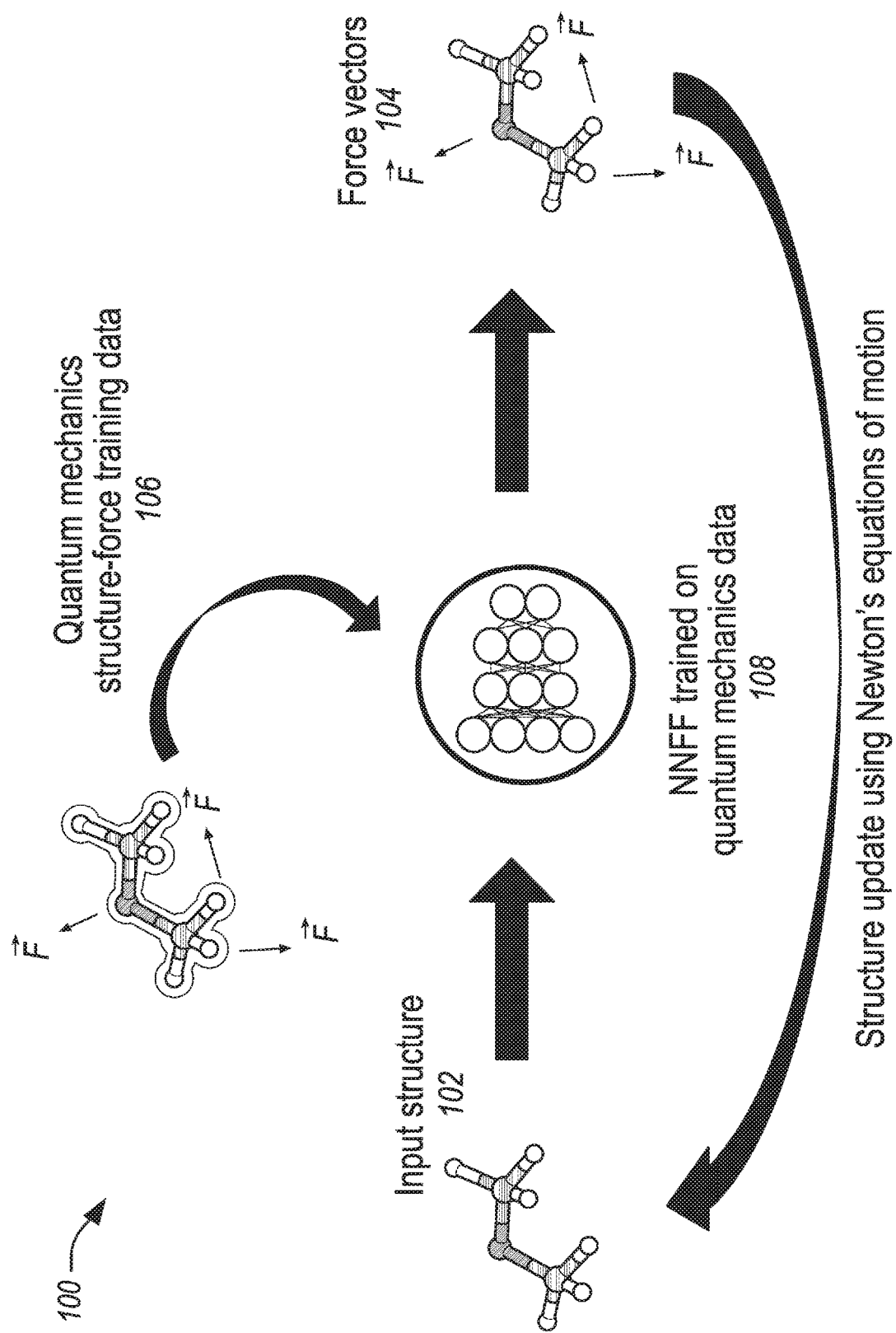
FIG. 1 is an example diagram of use of a neural network for performing molecular dynamics simulation.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The term "substantially" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

Molecular dynamics (MDs) methodologies are beneficial for studying physical phenomena, such as, but not limited to, ionic transport, chemical reactions, and material bulk and surface degradation in material systems, such as, devices or functional materials. Non-limiting examples of such material systems include fuel cells, surface coatings, batteries, water desalination, and water filtration. Methodologies exist to calculate the underlying atomic forces used in the simulation of the motion of atoms. The ab-initio quantum mechanics approach is very accurate but is also very expensive because of the tremendous amount of computational resources necessary to apply the approach.

Neural networks have been utilized to fit and predict quantum mechanics energies. These methodologies have been referred to as neural network force fields (NNFF). Derivatives of energy with respect to atomic positions and forces are predicted using quantum mechanics energies. However, these methodologies are also computationally extensive. In light of the foregoing, what is needed is a computational methodology for calculating atomic forces that delivers an adequate level of accuracy while consuming a reasonable amount of computing resources.

Molecular dynamics use atomic positions (and possibly charges, bonds, or other structural information) to calculate interatomic forces of each atom, which are consequently used to modify the velocities of atoms in the simulation. The resulting trajectories of the atoms are utilized to describe physical phenomena, such as, but not limited to, ionic transport motion in batteries (e.g., Li-ion batteries) and fuel cells (e.g., fuel cell electrolyte), chemical reactions during bulk and surface material degradation, solid-state material phase change, molecular binding and protein folding for instance for drug design, biosciences, and biochemistry design. A tradeoff exists between the accuracy and size (measured by number of atoms and simulated dynamics time) of the simulation depending on the underlying method used to calculate the atomic forces. As set forth above, one accurate but expensive method uses the ab-initio quantum mechanics approach, known as ab-initio molecular dynamics (AIMD).

Existing work has been done on providing less expensive methods. In J. P. Mailoa, et al. arXiv:1905.02791. A Fast Neural Network Approach for Direct Covariant Forces Prediction in Complex Multi-Element Extended Systems. Accepted in *Nat. Mach. Intell.* (2019), a version of fast NNFF is proposed to directly predict atomic force vectors in an extended atomistic system by using rotation-covariant features. However, the feature extraction relies on feature engineering, making it less accurate.

In T. Xie, et al. Crystal Graph Convolutional Neural Networks for an Accurate and Interpretable Prediction of Material Properties. Phys. Rev. Lett. 120, 145301 (2018), a convolutional graph neural network is used to automate feature extraction from an atomistic structure to enable total system energy prediction. Using this approach, a message passing mechanism between atoms and bonds is controlled by a network designer.

In B. Chen, et al. Path-Augmented Graph Transformer Network. arXiv:1905.12712 (2019), a graph transformer neural network architecture augmented with path (real chemical bond) features is used to predict total system energy. Sequence and strength of message passing is controlled by the attention mechanism, which utilizes the path features.

In K. T. Schutt, et al. SchNet: A continuous-filter convolutional neural network for modeling quantum interactions. arXiv:1706.08566 (2017), a convolutional graph network is used to automate feature extraction by message passing between atoms without an attention mechanism. The architecture enables prediction of molecule energies, and by taking derivatives of the entire molecule energy network with respect to positions to predict atomic force vectors, this algorithm is similar to the J. P. Mailoa work and can be used for actual molecular dynamics simulation.

In P. Velockovic, et al. Graph Attention Networks. arxiv: 1710.10903 (2018), the graph transformer neural network architecture is introduced. As of yet, this architecture has not been adapted to solving molecular dynamics problems.

The methods described in the first four references above are for fast regression of atomistic force vectors and/or energies using deep learning. These bypass expensive quantum mechanic simulations such as density functional theory (DFT) or quantum chemistry. In the context of molecular dynamics (MD) simulation, this means MD simulation can be performed with accuracy approaching that of ab-initio MD (AIMD), with significantly lower computational cost.

FIG. 1 illustrates an example diagram 100 of use of a neural network for performing MD simulation. Given an atomistic input structure 102, quantum mechanics (such as DFT, which is expensive) may be utilized to calculate system energy and atomic force vectors 104. The atoms may then be moved based on the calculated force vectors using Newtonian equations of motion (this setup is called molecular dynamics, or MD, simulations) to study phenomena such as ionic transport, chemical reactions, etc. In a MD simulation, iteration in the order of hundreds of millions of time steps is typical, making an MD simulation based on DFT force calculation very expensive. Alternatively, given a sufficient amount of quantum mechanics atomistic structure force vector training data 106, a neural network 108 may be trained to accurately do this force calculation. This effectively bypasses quantum mechanics force calculation and enables accurate force calculation at low computational cost, allowing for the performance of larger and longer MD simulations.

As opposed to prior approaches, the disclosed approach uses a graph transformer network, instead of a graph neural network for use in neural network force field approaches, to force vector regression. Graph transformers, as discussed in detail below, provide for higher accuracy as compared to graph neural networks for graph learning problems. Moreover, as opposed to prior approaches, the described approach uses a slightly different graph structure. Instead of constructing a graph with atoms as nodes and bonds as edges; in this architecture, atoms, bonds, or other molecular objects may be considered as nodes in the graph. This affords greater flexibility and allows the incorporation of features that are not compatible with a simpler graph structure. The described approach can be used to make force vector predictions for use in molecular dynamics simulations, and may further be used to train a machine learning system that can be used for such applications.

In general, with respect to a graph neural network architecture, in a standard feedforward neural network there are several layers, each of which modifies a hidden representation via multiplication by a weight matrix. In a graph neural network, operation is performed on a graph, and each node in the graph has such a representation. Suppose H is a matrix with each column acting as a representation of a node. In a graph neural network layer with H as input and Ĥ as output, the two are related by:

$$\hat{H} := H + \sigma(WHA).$$

Here, W is a learnable weight matrix, A is a fixed mixing matrix that combines information based on the structure of the graph, and σ is an activation function (e.g. tanh or ReLU). More intuitively, WH applies the layer's weights to each node, and then multiplication by A combines this information based on the structure of the graph (for example, if A is the normalized adjacency matrix of the graph, then multiplication by A averages the hidden state of each node's neighbors in the graph). There are a number of possible choices for A, but once chosen it remains fixed throughout training and testing. After applying the activation function, the layer input is added again, a common trick for improving training speed and convergence.

In a graph transformer, a layer operates by:

$$\tilde{H} := H + \sigma(W_1 H \text{ softmax}(H W_2 W_3^T H^T))$$

where now $W_1$, $W_2$, $W_3$ are all learnable weight matrices, and the softmax function is applied to each column independently. The essential difference here is that A, which is fixed during neural network training, has been replaced with the expression softmax($H W_2 W_3^T H^T$). This expression, called an attention mechanism, involves both H and some learnable parameters; the network can therefore adapt the mixing matrix to different types of inputs, and learns the best way to combine information by learning $W_2$ and $W_3$ during training.

The attention mechanism in the graph transformer is further augmented by incorporating a distance term:

$$\tilde{H} := H + \sigma(W_1 H \text{ softmax}(H W_2 W_3^T H^T - \gamma D))$$

where D is a distance matrix (that is, $D_{ij}$ is the squared distance between nodes i and j), and $\gamma$ is a learnable scalar parameter. This has the effect of reducing the strength of interactions between pairs of nodes as their distance increases, and $\gamma$ learns how much weight to assign to this reduction.

In the architectures described above, each layer is applied in sequence, resulting in a total network output $\tilde{H}$ with each column of $\tilde{H}$ representing the hidden state of a particular node. If node-level predictions are being made (i.e., predicting a property for each node), then this output can be used as the prediction. If instead a property of the graph is being predicted, the columns of $\tilde{H}$ may be combined (usually by summing or by averaging over columns) to obtain a single graph-level output.

Turning back to MD simulation, given a snapshot of a molecule, the object is to predict the force vector $F_i \in \mathbb{R}^3$ acting on each atom i. It is possible to do this with a straightforward graph neural network training scheme: the input to the network is some information about the molecule encoded as a graph, with atoms as nodes, and the output is the predicted force vector. However, there is nothing enforcing conservation of energy among these predictions; thus, they are not suitable for direct use in molecular dynamics simulations. A neural network force field (NNFF) approach may be used instead, with better results.

Figure 2:
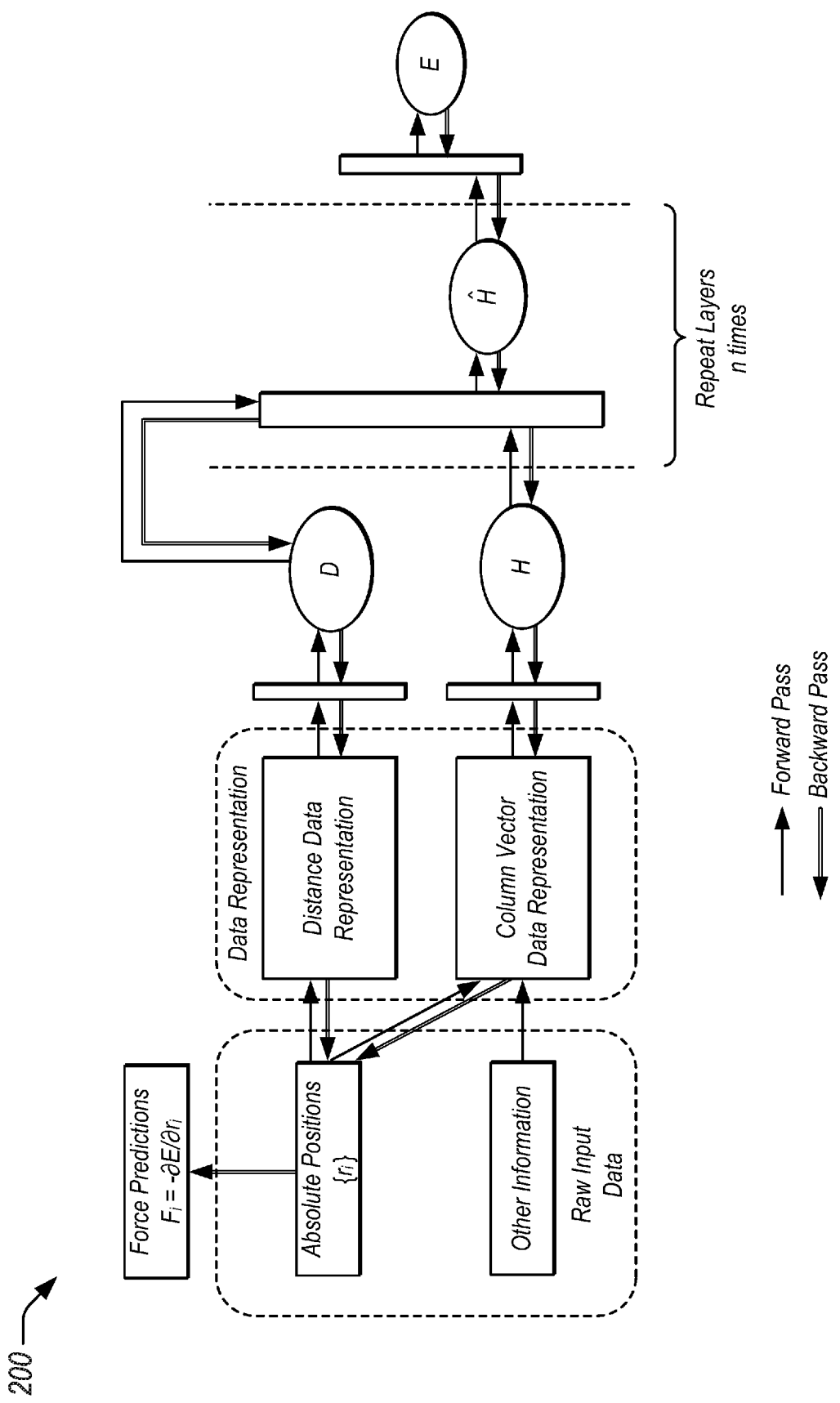
FIG. 2 is an example diagram of a graph transformer neural network force field (GTFF) approach to MD simulation.

FIG. 2 is an example diagram 200 of a graph transformer neural network force field (GTFF) approach to MD simulation. In such an approach, the input to the neural network is the position of each atom $r_i$, as well as any other relevant information. The output of the final layer is summed to produce a prediction for the energy E of the molecule. The derivative $\partial E/\partial r_i$ may then be calculated, where its negative $-\partial E/\partial r_i$ may be used as the prediction of the force acting on atom i. Provided that the neural network is a smooth function of the set of positions $\{r_i\}$, the derivatives $-\partial E/\partial r_i$ are guaranteed to conserve energy.

The NNFF approach in conjunction with graph neural network architectures may be built upon by its combination with the graph transformer architecture. As shown, the GTFF uses a graph transformer with L layers. Once the graph transformer is trained, the algorithm may be performed as follows:

1. Let $\{r_i\}$ be the positions of atoms in a molecule. Organize molecule information into a graph, with atoms as nodes; let $H^0$ be the matrix with each column representing a node in the graph ($\{r_i\}$ may or may not be included in $H^0$). $H^0$ may also include other information, such as element type, partial charge, chemical environment, distance to neighbors, angles to neighbors, electronegativity, valence, any other quantum or classical information. $H^0$ may be encoded in various ways, for instance as a scalar or as a vector, with various bases such as one-hot-encoding, sine, cosine, exponential, etc. Let $\{r_i\}$ also be used to construct the distance matrix D.

2. For i=0, . . . , L−1:

$$H^{\ell+1} \leftarrow H^\ell + \sigma(W_1^\ell H^\ell \text{ softmax } (H^\ell W_2^\ell W_3^{\ell T} H^{\ell T} - \gamma^\ell D))$$

This is done to pass hidden state through graph transformer layer $\ell$;

3. Sum or mean over columns of $H^L$ to produce a scalar molecular energy E;

4. Make a backward pass through the network (as shown by the double-line arrows), iteratively calculating derivatives at each layer, to calculate $-\partial E/\partial r_i$ for each i; and 5. Return force predictions $F_i := -\partial E/\partial r_i$.

The GTFF may be trained as a deep neural network. For instance, a loss function L may be formed to compare the force predictions $-\partial E/\partial r_i$ to ground truth forces on a labeled dataset, and the network weights (above, $W_i^\ell$ and $\gamma^\ell$) may then be optimized with respect to this loss using gradient descent. Because the gradient descent is being performed on a gradient, this requires the computation of higher-order derivatives; each training iteration will thus take approximately twice as long as a feedforward neural network.

Variations on the GTFF approach are possible. For instance, while the graph as described above assumes that all nodes are atoms, it may be desirable in some instances to include other molecular objects as nodes in the graph, such as bonds, triplets of atoms, etc. This is useful for incorporating features of the molecule that cannot be represented by atoms alone (e.g., bond order for bonds, bond angle for triplets, etc.) and may be helpful for calculating the total energy of the system. If this information is included as nodes, their distance to all other objects in the graph should also be defined, so that D remains well-defined. However, the derivative of energy with respect to the positions of these objects may not be required to be computed, as we are only calculating force vectors for the atoms.

With respect to another possible variation, in step 3 above it is indicated that a sum or mean over columns of $H^\ell$ is performed. However, it should be noted that in other examples another function may be applied that is permutation invariant over columns of $H^\ell$. As yet a further possibility, this combining operation may be implemented as another small neural network.

With respect to yet another possible variation, in steps 3 and 4, the prediction E is assumed to be a single scalar value (and thus it is assumed that the output size of the final layer is 1). In other examples, E may be a vector in $\mathbb{R}^k$ and may take the force to be the sum of these derivatives: $F_i := \sum_{j=1}^k -\partial E_j/\partial r_i$. Since each summand obeys conservation of energy, the entire sum will as well. A multidimensional energy E may be easier to learn than a scalar E.

Figure 3:
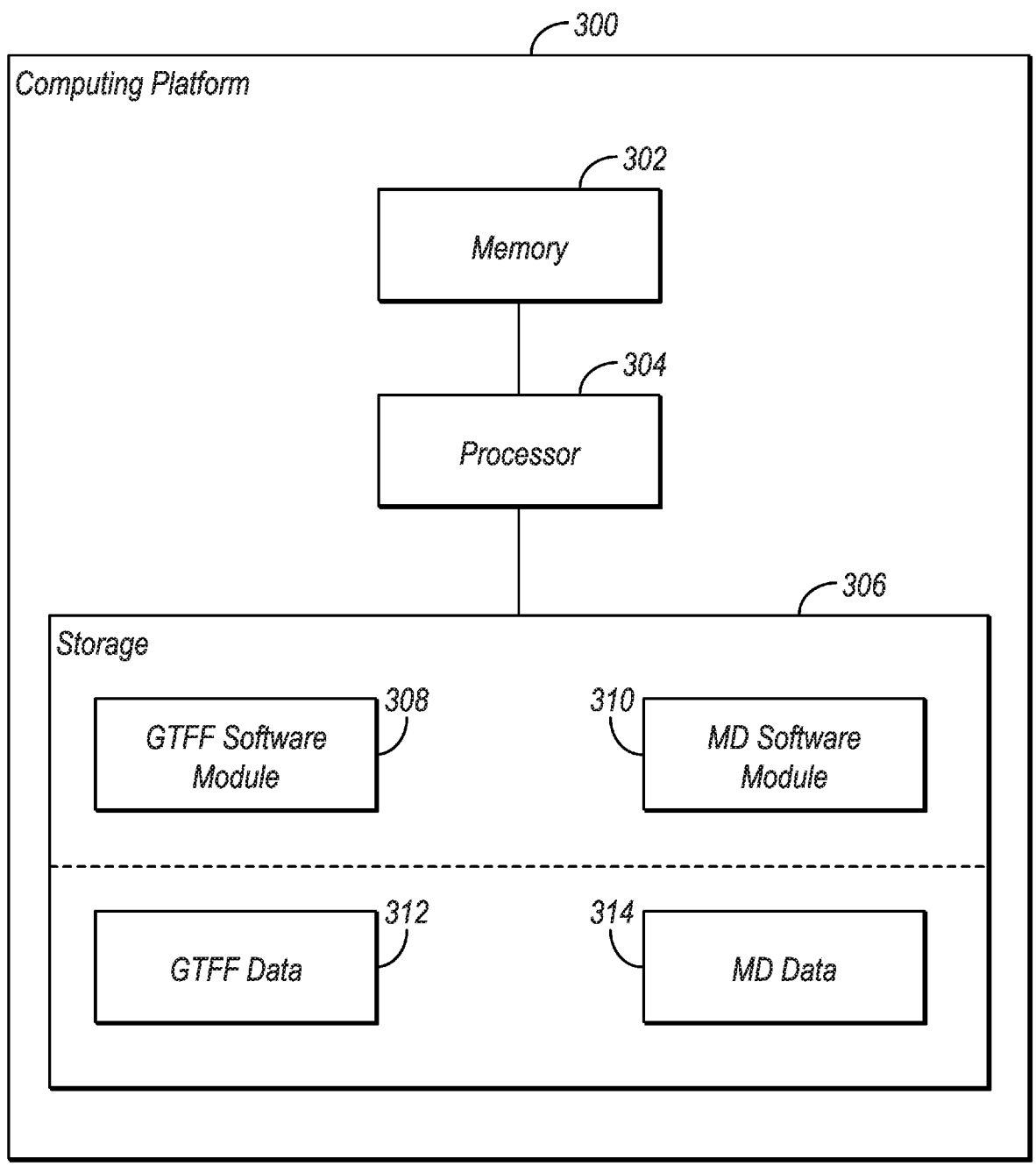
FIG. 3 is a schematic diagram of a computing platform that may be utilized to implement the GTFF algorithms in one or more embodiment, for instance, the GTFF algorithm of FIG. 2.

The GTFF algorithms and/or methodologies of one or more embodiments are implemented using a computing platform, as shown in FIG. 3. The computing platform 300 may include memory 302, processor 304, and non-volatile storage 306. The processor 304 may include one or more devices selected from high-performance computing (HPC) systems including high-performance cores, microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on computer-executable instructions residing in memory 302. The memory 302 may include a single memory device or a number of memory devices including, but not limited to, random access memory (RAM), volatile memory, non-volatile memory, static random access memory (SRAM), dynamic random access memory (DRAM), flash memory, cache memory, or any other device capable of storing information. The non-volatile storage 306 may include one or more persistent data storage devices such as a hard drive, optical drive, tape drive, non-volatile solid state device, cloud storage or any other device capable of persistently storing information.

The processor 304 may be configured to read into memory 302 and execute computer-executable instructions residing in GTFF software module 308 of the non-volatile storage 306 and embodying GTFF algorithms and/or methodologies of one or more embodiments. The processor 304 may be further configured to read into memory 302 and execute computer-executable instructions residing in MD software module 310 (such as LAMMPS) of the non-volatile storage 306 and embodying MD algorithms and/or methodologies. The software modules 308 and 310 may include operating systems and applications. The software modules 308 and 310 may be compiled or interpreted from computer programs created using a variety of programming languages and/or technologies, including, without limitation, and either alone or in combination, Java, C, C++, C#, Objective C, Fortran, Pascal, Java Script, Python, Perl, and PL/SQL. In one embodiment, PyTorch, which is a package for the Python programming language, may be used to implement code for the GTFFs of one or more embodiments. The code framework may be based on a crystal graph convolutional neural network (CGCNN) code, which is available under license from the Massachusetts Institute of Technology of Cambridge, Mass.

Upon execution by the processor 304, the computer-executable instructions of the GTFF software module 308 and the MD software module 310 may cause the computing platform 300 to implement one or more of the GTFF algorithms and/or methodologies and MD algorithms and/or methodologies, respectively, disclosed herein. The non-volatile storage 306 may also include GTFF data 312 and MD data 314 supporting the functions, features, and processes of the one or more embodiments described herein.

The program code embodying the algorithms and/or methodologies described herein is capable of being individually or collectively distributed as a program product in a variety of different forms. The program code may be distributed using a computer readable storage medium having computer readable program instructions thereon for causing a processor to carry out aspects of one or more embodiments. Computer readable storage media, which is inherently non-transitory, may include volatile and non-volatile, and removable and non-removable tangible media implemented in any method or technology for storage of information, such as computer-readable instructions, data structures, program modules, or other data. Computer readable storage media may further include RAM, ROM, erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store the desired information and which can be read by a computer. Computer readable program instructions may be downloaded to a computer, another type of programmable data processing apparatus, or another device from a computer readable storage medium or to an external computer or external storage device via a network.

Computer readable program instructions stored in a computer readable medium may be used to direct a computer, other types of programmable data processing apparatus, or other devices to function in a particular manner, such that the instructions stored in the computer readable medium produce an article of manufacture including instructions that implement the functions, acts, and/or operations specified in the flowcharts or diagrams. In certain alternative embodiments, the functions, acts, and/or operations specified in the flowcharts and diagrams may be re-ordered, processed serially, and/or processed concurrently consistent with one or more embodiments. Moreover, any of the flowcharts and/or diagrams may include more or fewer nodes or blocks than those illustrated consistent with one or more embodiments.

While all of the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the general inventive concept.

What is claimed is:

1. A computational method for simulating motion of elements within a multi-element system using a graph transformer neural network (GTFF), the method comprising:
converting a molecular dynamics snapshot of the elements within the multi-element system into a graph with atoms as nodes of the graph;
defining a matrix such that each column of the matrix represents a node in the graph;
defining a distance matrix according to a set of relative positions of each of the atoms;
iterating through the GTFF using an attention mechanism, operating on the matrix and augmented by incorporating the distance matrix, to pass hidden state from a current layer of the GTFF to a next layer of the GTFF;
performing a combination over the columns of the matrix to produce a scalar molecular energy;
making a backward pass through the GTFF, iteratively calculating derivatives at each of the layers of the GTFF to compute a prediction of force acting on each atom; and
returning the prediction of the force acting on each atom.

2. The computational method of claim 1, wherein the combination over the columns of the matrix is implemented as a sum.

3. The computational method of claim 1, wherein the combination over the columns of the matrix is implemented as a mean.

4. The computational method of claim 1, wherein the combination over the columns of the matrix is implemented using a neural network.

5. The computational method of claim 1, further comprising including, in the matrix as nodes of the graph, other molecular objects in addition to the atoms, other molecular objects including one or more of bonds or quantum state of the atoms.

6. The computational method of claim 5, further comprising defining distances of the other molecular objects to other objects in the graph such that the distance matrix remains well-defined for each element.

7. The computational method of claim 1, further comprising training the GTFF as a deep neural network using a loss function formed to compare the force predictions to ground truth forces on a labeled dataset, such that network weights are optimized with respect to the loss function using gradient descent.

8. The computational method of claim 1, wherein the computational method is integrated into molecular dynamics (MD) software.

9. The computational method of claim 1, further comprising utilizing softmax in the attention mechanism for forward propagation of the hidden state through the GTFF.

10. A computational system for simulating motion of elements within a multi-element system using a graph transformer neural network (GTFF), the system comprising:
   a memory storing instructions of a GTFF algorithm of molecular dynamics (MD) software; and
   a processor programmed to execute the instructions to perform operations including to
      convert a molecular dynamics snapshot of the elements within the multi-element system into a graph with atoms as nodes of the graph;
      define a matrix such that each column of the matrix represents a node in the graph;
      define a distance matrix according to a set of relative positions of each of the atoms;
      iterate through the GTFF using an attention mechanism, operating on the matrix and augmented by incorporating the distance matrix, to pass hidden state from a current layer of the GTFF to a next layer of the GTFF;
      perform a combination over the columns of the matrix to produce a scalar molecular energy;
      make a backward pass through the GTFF, iteratively calculating derivatives at each of the layers of the GTFF to compute a prediction of force acting on each atom; and
      return the prediction of the force acting on each atom.

11. The computational system of claim 10, wherein the processor is further programmed to execute the instructions to perform the combination over the columns of the matrix as a sum.

12. The computational system of claim 10, wherein the processor is further programmed to execute the instructions to perform the combination over the columns of the matrix as a mean.

13. The computational system of claim 10, wherein the processor is further programmed to execute the instructions to perform the combination over the columns of the matrix using a neural network.

14. The computational system of claim 10, wherein the processor is further programmed to execute the instructions to include, in the matrix as nodes of the graph, other molecular objects in addition to the atoms, the other molecular objects including one or more of bonds or quantum state of the atoms.

15. The computational system of claim 14, wherein the processor is further programmed to execute the instructions to define distances of the other molecular objects to other objects in the graph such that the distance matrix remains well-defined for each element.

16. The computational system of claim 10, wherein the processor is further programmed to execute the instructions to train the GTFF as a deep neural network using a loss function formed to compare the force predictions to ground truth forces on a labeled dataset, such that network weights are optimized with respect to the loss function using gradient descent.

17. The computational system of claim 10, wherein the processor is further programmed to execute the instructions to utilize softmax in the attention mechanism for forward propagation of the hidden state through the GTFF.

18. A non-transitory computer-readable medium comprising instructions for simulating motion of elements within a multi-element system using a graph transformer neural network (GTFF) that, when executed by a processor, cause the processor to:
   convert a molecular dynamics snapshot of the elements within the multi-element system into a graph with atoms as nodes of the graph;
   define a matrix such that each column of the matrix represents a node in the graph;
   define a distance matrix according to a set of relative positions of each of the atoms;
   iterate through the GTFF using an attention mechanism, operating on the matrix and augmented by incorporating the distance matrix, to pass hidden state from a current layer of the GTFF to a next layer of the GTFF;
   perform a combination over the columns of the matrix to produce a scalar molecular energy;
   make a backward pass through the GTFF, iteratively calculating derivatives at each of the layers of the GTFF to compute a prediction of force acting on each atom; and
   return the prediction of the force acting on each atom.

19. The medium of claim 18, further comprising instructions that, when executed by a processor, cause the processor to:
   include, in the matrix as nodes of the graph, other molecular objects in addition to the atoms, other molecular objects including one or more of bonds or quantum state of the atoms; and
   define distances of the other molecular objects to other objects in the graph such that the distance matrix remains well-defined for each element.

20. The medium of claim 18, further comprising instructions that, when executed by a processor, cause the processor to train the GTFF as a deep neural network using a loss function formed to compare the force predictions to ground truth forces on a labeled dataset, such that network weights are optimized with respect to the loss function using gradient descent.

* * * * *